US006915496B2

(12) United States Patent
Alpert et al.

(10) Patent No.: US 6,915,496 B2
(45) Date of Patent: Jul. 5, 2005

(54) APPARATUS AND METHOD FOR INCORPORATING DRIVER SIZING INTO BUFFER INSERTION USING A DELAY PENALTY ESTIMATION TECHNIQUE

(75) Inventors: Charles Jay Alpert, Round Rock, TX (US); Chong-Nuen Chu, Ames, IA (US); Rama Gopal Gandham, Wappinhgers Falls, NY (US); Milos Hrkic, Austin, TX (US); Jiang Hu, College Station, TX (US); Chandramouli V. Kashyap, Round Rock, TX (US); Stephen Thomas Quay, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 110 days.

(21) Appl. No.: 10/255,469

(22) Filed: Sep. 26, 2002

(65) Prior Publication Data

US 2004/0064793 A1 Apr. 1, 2004

(51) Int. Cl.[7] ............................................... G06F 17/50
(52) U.S. Cl. ..................... 716/5; 716/2; 716/8; 716/10; 716/13
(58) Field of Search .............................. 716/5, 2, 13, 8, 716/10

(56) References Cited

U.S. PATENT DOCUMENTS

| 5,798,935 | A | * | 8/1998 | Doreswamy et al. | 716/6 |
| 6,009,248 | A | * | 12/1999 | Sato et al. | 716/2 |
| 6,117,182 | A | * | 9/2000 | Alpert et al. | 716/8 |
| 6,347,393 | B1 | * | 2/2002 | Alpert et al. | 716/2 |
| 6,543,041 | B1 | * | 4/2003 | Scheffer et al. | 716/10 |
| 6,560,752 | B1 | * | 5/2003 | Alpert et al. | 716/2 |
| 6,591,411 | B2 | * | 7/2003 | Alpert et al. | 716/13 |

2002/0133799 A1 9/2002 Alpert et al.

OTHER PUBLICATIONS

J. Lillis et al., Optimal Wire Sizing and Buffer Insertion for Low Power and a Generalized Delay Model, IEEE/ACM International COnference on Computer–Aided Design, pp. 138–143, Nov. 1995.*

J. Lillis et al., Optimal and Efficient Buffer Insertion and Wire Sizing, Proceedings of the IEEE Custom Integrated Circuits Conference, pp. 259–262, May 1995.*

J. Cong et al., Simultaneous Driver and Wire Sizing for Performance and Power Optimization, IEEE Transactions on Very Large Scale Integration Systems, pp. 408–425, Dec. 1994.*

J. Lillis et al., Optimal Wire Sizing and Buffer Insertion for Low Power and a Generalized Delay Model, IEEE Journal of Solid–State Circuits, pp. 437–447, Mar. 1996.*

(Continued)

*Primary Examiner*—A. M. Thompson
(74) *Attorney, Agent, or Firm*—Duke W. Yee; Casimer K. Salys; Francis Lammes

(57) ABSTRACT

An apparatus and method for incorporating driver sizing into buffer insertion such that the two optimization techniques are performed simultaneously are provided. The apparatus and method extends van Ginneken's algorithm to handle driver sizing by treating a source node as a "driver library." With the apparatus and method, the circuit design is converted to a Steiner tree representation of the circuit design. Buffer insertion is performed on the Steiner tree using the van Ginneken algorithm to generate a first set of possible optimal solutions. For each solution in the first set, a driver of the same type as the original driver in the Steiner tree is selected from a driver library and virtually inserted into the solution. A delay penalty is retrieved for the selected driver, which is then used long with the new driver's characteristics to generate a second set of solutions based o the first set of solutions.

19 Claims, 3 Drawing Sheets

OTHER PUBLICATIONS

C. Alpert et al., Simultaneous Driver Sizing and Buffer Insertion Using a Delay Penalty Estimation Technique, IEEE Transactions on Computer–Aided Design of Integrated Circuits and Systems, pp. 136–141, Jan. 2004.*

J. COng et al., Simultaneous Driver and Wire Sizing for Performance and Power Optimization, IEEE/ACM International Conference on Computer–Aided Design, pp. 206–212, Nov. 1994.*

Alpert et al, "Simultaneous Driver Sizing and Buffer Insertion Using a Delay Penalty Estimation Technique", 2002 International Symposium on Physical Design, Apr. 2002, pp. 104–109.

* cited by examiner

| Driver Sizing Extended van Ginneken's Algorithm |
|---|
| 1. Set S to list of all candidate solutions at source<br>2. Set S'=0<br>3. For each candidate (c,q) in the set S do<br>4. For each driver of type p in the driver library<br>    Let q'=q−Delay (p,c) − D(Cp)<br>    Set S'=S'∪{(c,q')}<br>5. Return candidate (c,q') such that q'=max{q|(c,q) in the set S'} |

APPARATUS AND METHOD FOR INCORPORATING DRIVER SIZING INTO BUFFER INSERTION USING A DELAY PENALTY ESTIMATION TECHNIQUE

RELATED APPLICATIONS

The present invention is related to the invention disclosed in copending and commonly assigned U.S. patent application Ser. No. 09/810,075, now U.S. Pat. No. 6,591,411 B2 entitled "APPARATUS AND METHOD FOR DETERMINING BUFFERED STEINER TREES FOR COMPLEX CIRCUITS," filed on Mar. 15, 2001, which is hereby incorporated by reference.

BACKGROUND OF THE INVENTION

1. Technical Field

The present invention provides an apparatus and method for incorporating driver sizing into buffer insertion. Specifically, the present invention provides an apparatus and method for incorporating driver sizing into buffer insertion using a delay penalty estimation technique.

2. Description of Related Art

It is now widely accepted that interconnect performance is becoming increasingly dominant over transistor and logic performance in the deep submicron regime. Buffer insertion is now a fundamental technology used in modern VLSI design methodologies. As gate delays decrease with increasing chip dimensions, however, the number of buffers required quickly rises. It is expected that close to 800,000 buffers will be required for 50 nanometer technologies. It is critical to automate the entire interconnect optimization process to efficiently achieve timing closure.

The problem of inserting buffers to reduce the delay on signal nets has been recognized and studied. A closed form solution for two-pin nets has been proposed by van Ginneken. Van Ginneken's dynamic programming algorithm, described in "Buffer Placement in Distributed RC-tree Networks for Minimal Elmore Delay," Int'l Symposium on Circuits and Systems, 1990, pp. 865–868, which is hereby incorporated by reference, has become a classic in the field. Given a fixed Steiner tree topology, the van Ginneken algorithm finds the optimal buffer placement on the topology under an Elmore delay model for a single buffer type and simple gate delay model. Several extensions to this work have been proposed. Together, these enhancements make the van Ginneken style of buffer insertion quite potent as it can handle many constraints, buffer types, and delay models, while retaining optimality under many of these conditions. Most recently, research on buffer insertion has focused on accommodating various types of blockage constraints.

In addition to buffer insertion, driver sizing is an effective transform for achieving timing closure in placed designs. Driver sizing involves trying different size driver circuit elements for a net and determining an optimum result for the net. With driver sizing, drivers are instantiated at various power levels, among other characteristics, while preserving the same logic function. Choosing a different driver size will result in different timing and power characteristics for the design. The goal is to pick the driver size which results in the best possible timing for the given net.

Typically, buffer insertion and driver sizing are performed individually, sequentially, and perhaps even iteratively alternating between the two optimization techniques. The problem is that the two optimization techniques of buffer insertion and driver sizing affect each other. Thus, optimizing a net using these optimization techniques in sequence can yield a solution that is sub-optimal.

Thus, it would be beneficial to have an apparatus and method for incorporating driver sizing into buffer insertion such that driver sizing and buffer insertion are performed simultaneously.

SUMMARY OF THE INVENTION

The present invention provides an apparatus and method for incorporating driver sizing into buffer insertion such that the two optimization techniques are performed simultaneously. In particular, the apparatus and method according to a preferred embodiment extends van Ginneken's algorithm to handle driver sizing by treating a source node as a "driver library".

With the present invention, the circuit design is converted to a Steiner tree representation of the circuit design. Buffer insertion is performed on the Steiner tree using the van Ginneken algorithm to generate a first set of possible optimal solutions. For each solution in the first set, a driver of the same type as the original driver in the Steiner tree is selected from a driver library and virtually inserted into the solution. A delay penalty is retrieved for the selected driver. This delay penalty is then used with the new driver's characteristics to generate a second set of solutions based on the first set of solutions.

A determination is made as to whether there are other drivers of this type in the driver library. If so, the operation returns and a next driver of this driver type is selected. If not, the second set of solutions is traversed to identify a solution having a maximum slack. The solution having the maximum slack is then output as the optimized Steiner tree representation of the circuit design. This optimized Steiner tree representation may then be used to fabricate the circuit.

These and other features and advantages of the present invention will be described in, or will become apparent to those of ordinary skill in art in view of, the following detailed description of the preferred embodiments.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Driver sizing and buffer insertion are effective optimization techniques for achieving timing closure in a placed circuit design. However, applying driver sizing and buffer insertion individually or sequentially causes non-optimal solutions to be generated. The present invention provides a mechanism that overcomes the drawbacks of only using driver sizing and buffer insertion individually or sequentially by providing an apparatus and method for performing these techniques simultaneously. The advantages of performing simultaneous buffer insertion and driver sizing are best illustrated with reference to FIGS. 1A–1D.

Figure 1A:
FIGS. 1A–D are diagrams of an exemplary net used to illustrate the solutions obtained from applying buffer insertion and driver sizing sequentially and simultaneously.

Consider the example shown in FIG. 1A of a woefully under powered AND gate driving a long interconnect to a single sink. Left alone, a net like this will likely have both prohibitively large delay and poor signal integrity. By applying driver sizing first as in FIG. 1B, the driver sizing algorithm will invariably choose an extremely large driver to handle the large capacitive load. Although this will improve the delay characteristics somewhat, the net will likely still need buffers to deal with the resistive interconnect.

Figure 1B:
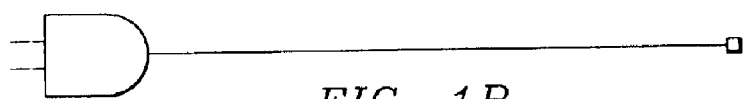
Figure 1C:
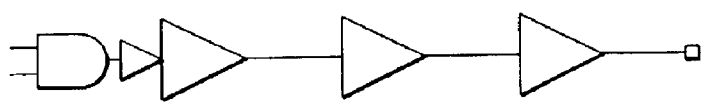

If buffer insertion is applied first, a solution like that in FIG. 1C will result. In this case, buffers are added immediately after the driver, which has the effect of artificially "powering up" the driver before propagating the signal down any significant length of interconnect. This can cause gross oversizing of the driver which wastes power and area and can cause noise problems on other nets. Further, this artificial "powering up" can lead to a suboptimal timing solution compared to a more moderately sized driver with buffer insertion on the interconnect.

Figure 1D:
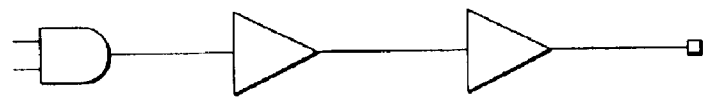

The solution in FIG. 1D resulting from an optimization using simultaneous buffer insertion and driver sizing, as with the present invention, contains a more reasonably sized driver than that in FIG. 1B and uses fewer buffers than the solution in FIG. 1C. Applying buffer insertion and driver sizing sequentially cannot obtain this solution.

The present invention provides a mechanism for performing buffer insertion and driver sizing optimizations to a circuit design simultaneously so as to obtain an optimum net design. With the present invention, timing is optimized by performing buffer insertion to obtain a first set of possible solutions and then performing driver sizing on the first set of possible solutions to generate a second set of possible solutions. A best candidate is selected from the second set of possible solutions based on slack and output as the optimum result for the net design.

The present invention may be implemented in hardware, software, or a combination of hardware and software. In addition, the present invention may be implemented in a stand alone computing device, such as a personal computer, or in a distributed data processing system. For example, the present invention may be implemented on a server in a distributed data processing system in which a client device provides input to the server regarding a circuit design that is to be generated. The functions of the present invention, as detailed hereafter, may then be applied to the input received from the client device. The results of performing the functions of the present invention may then be returned to the client device for use by an user of the client device.

Figures 2, 3:
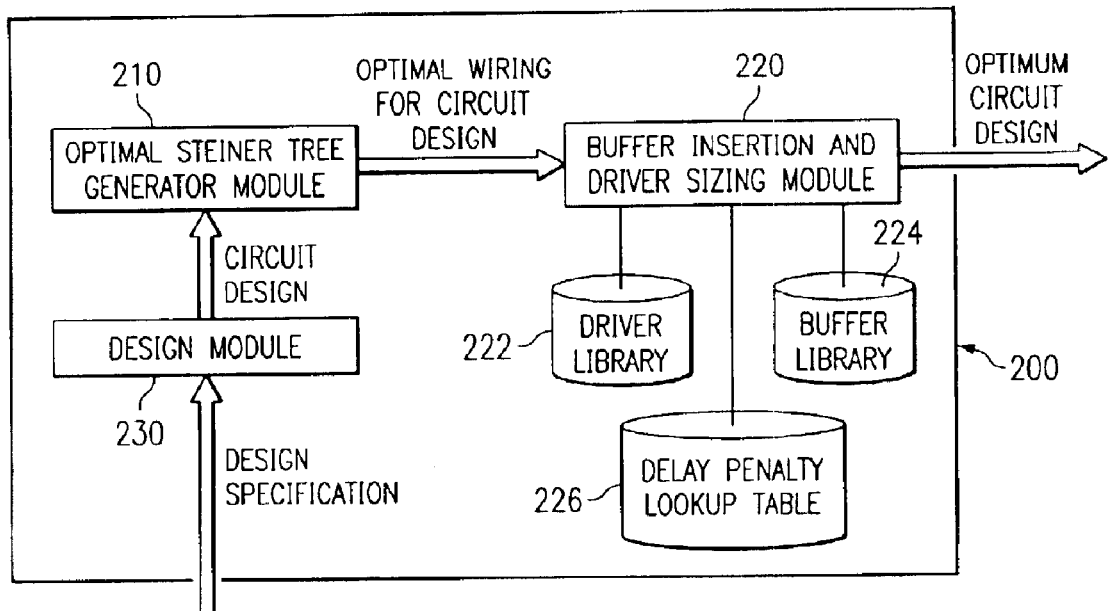
FIG. 2 is an exemplary block diagram illustrating the components of a design tool in accordance with the present invention.
FIG. 3 is a diagram illustrating a modified form of the Van Ginneken algorithm in which driver sizing is performed simultaneously with buffer insertion.

FIG. 2 is an exemplary block diagram illustrating the components of a design tool in accordance with the present invention. As shown in FIG. 2, the design tool 200 includes an optimal Steiner tree generator module 210, a buffer insertion and driver sizing module 220 and a design module 230. The design module 230 operates in a manner generally known in the art. The optimal Steiner tree generator module 210 may operate to generate a Steiner tree from the circuit design received from the design module 230. The generation of Steiner trees from circuit design specifications is generally known in the art. In a preferred embodiment, the optimal Steiner tree generator module 210 operates in accordance with one or more of the methodologies described in copending and commonly assigned U.S. patent application Ser. No. 09/810,075 entitled "APPARATUS AND METHOD FOR DETERMINING BUFFERED STEINER TREES FOR COMPLEX CIRCUITS," filed on Mar. 15, 2001, which is hereby incorporated by reference.

The buffer insertion and driver sizing module 220 operates in accordance with the present invention to perform both buffer insertion and driver sizing optimizations simultaneously on the wiring pattern generated from the circuit design. The details of this combined approach to optimizing the circuit design will be described in greater detail hereafter.

In operation, the design module 230 receives a high-level design specification from a user and generates a chip design based on the high-level design specification. The chip design is then input to the optimal Steiner tree generator module 210 which generates an optimal wiring pattern for the chip design.

The optimal Steiner tree generator module 210 operates to generate an optimal Steiner tree wiring pattern. In a preferred embodiment, the optimal Steiner tree generator module 210 uses a two step process of clustering sinks in a circuit design based on similar characteristics and determining an optimal buffered Steiner tree for each cluster, as described in the incorporated U.S. patent application Ser. No. 09/810,075. The clusters are then treated as sinks and a global optimal buffered Steiner tree for the circuit is identified. The parameters that are input to the optimal Steiner tree generator module 210 may be input automatically from the design module 230, based on the particular design specification generated, may be input by a user via an input device, or the like.

The overall optimum Steiner tree is then input to the buffer insertion and driver sizing module 220 which takes the design specification and sizes the drivers of the nets and inserts appropriate buffers into the design to minimize delay along timing-critical paths, sharpen slew rates and fix capacitance and noise violations in the design. The buffer insertion and driver sizing module 220 makes use of a driver library 222, a buffer library 224, and a delay penalty lookup table 226 to perform the necessary driver sizing and buffer insertion in accordance with the present invention.

In particular, as discussed in greater detail hereafter, the buffer library 224 is utilized to obtain buffer information for use in buffer insertion to obtain a first set of possible optimal solutions for optimizing the Steiner tree. The driver library 222 is utilized to perform driver sizing of the first set of optimal solutions to obtain a second set of optimal solutions. The delay penalty lookup table 226 is used in generating the second set of optimal solutions to introduce a delay penalty associated with the drivers that compensates for increases in capacitance upstream caused by the driver and possible area concerns.

The buffer insertion and driver sizing module 220 selects an optimum solution having a maximum slack from this second set of optimal solutions. This operation may be performed for each Steiner tree of the circuit design. The result is an optimized design that is output to the data processing system.

With the present invention, simultaneous buffer insertion and driver sizing is achieved through extending the van Ginneken algorithm to handle driver sizing by treating the source node as a "driver library." Van Ginneken's algorithm starts from the sinks and recursively builds a set of buffer insertion "candidate" solutions until a single set of candidates is built for the source of the given Steiner tree. This set of candidates is completely independent of the driver strength. After the candidates for the source node are computed, the driver delay is taken into account for each candidate, then the candidate which maximizes the minimum slack to each sink is returned as the solution. This procedure is optimal for a given Steiner tree and a given Elmore delay model.

In extending van Ginneken's algorithm, it is first necessary to have a driver library containing various implementations and/or sizings of the same logic function as the original driver of the Steiner tree nets. Thus, the driver library consists of at least one driver type, and a plurality of possible drivers of that at least one driver type. Of course the driver library may include multiple driver types and multiple drivers within each driver type.

The extended van Ginneken's algorithm involves traversing a net from a sink to a source and generating a set S of candidate solutions for optimizing the nets of the Steiner tree wiring pattern. The term "candidate" and "candidate solution" as used herein means possible solutions for optimizing the timing, slew, etc. Of the nets in the Steiner tree. It should be appreciated that there may be many possible solutions, e.g., a three buffer insertion solution, two buffer insertion solution, etc., that may be used to optimize the Steiner tree wiring pattern. Each of these potential solutions are stored in the set S. This step is basically the use of the known van Ginneken's algorithm for buffer insertion to generate a set of possible solutions.

A new set S' of candidate solutions is initialized and set to the empty set. Each of the candidates in S are then stepped through and, for each driver of driver type p, corresponding to the driver type of the particular Steiner tree being analyzed, in the driver library, a new candidate is identified and added to S'. That is the plurality of different drivers in the driver library that are different in size or characteristic from that of the original driver but have the same logic function are used to generate a new set of potential solutions based on the set of solutions obtained from buffer insertion using the van Ginneken algorithm.

This step of the methodology involves "virtually" replacing the original driver with each of a plurality of different drivers of the same type as that of the original driver. That is, a new driver is selected from the driver library and a new slack is calculated for this driver using the slack of the solution from the set S. The particular driver selected and its corresponding slack is maintained for later use in selecting the optimum solution. For example, if the first set of solutions obtained from performing buffer insertion using the van Ginneken algorithm has 10 solutions and the driver library has 5 drivers of the same type as the original driver in the net, the second set of solutions would be comprised of 50 candidate solutions. These candidate solutions identify the driver selected and the corresponding calculated slack if that driver were inserted into the solution obtained from the buffer insertion.

From the candidates in S', a candidate solution having maximum slack is selected and returned as the optimum circuit design for the net. This operation may be performed repeatedly for each Steiner tree wiring pattern in the circuit design.

FIG. 3 shows pseudo code for implementing the extended van Ginneken algorithm in accordance with the present invention. In the pseudo code of FIG. 3, S is the set of candidate solutions obtained from buffer insertion using the van Ginneken algorithm, S' is the set of candidate solutions obtained from driver sizing of the candidate solutions in S, p is a particular driver type, c is a driving capacitance of a driver, q is the slack prior to driver sizing, q' is the slack after driver sizing, Delay(p,c) is the delay through this driver type having a driving capacitance c, Cp is the input capacitance of the driver, and D(Cp) is a delay penalty. So far, it has been assumed that the delay penalty D(Cp) is zero. However, as will be discussed hereafter, this delay penalty is important in obtaining an accurate and optimum solution for the optimization of the Steiner tree wiring pattern using simultaneous buffer insertion and driver sizing.

As shown in FIG. 3, step 1 computes the set S of all candidates at the source. Step 2 initializes the new set of candidates S' to the empty set. Step 3 iterates through the candidates in S. For each such candidate, Step 4 generates a new candidate for each driver type p and adds it to S'. Finally, Step 5 returns the solution in S' that has maximum slack.

The complexity of the algorithm shown in FIG. 3 is O($n^2B^2$+nM) where n is the number of possible buffer insertion locations, B is the size of the buffer library, and M is the size of the driver library. If M is less than O($nB^2$) (which should be the case most often) the complexity is O($n^2B^2$) which is the same as the original van Ginneken algorithm.

The obvious problem with this implementation is that the impact on the previous stage of the circuit is not taken into account. In practice, the algorithm above, assuming a delay penalty of zero, may often select the largest, i.e. strongest, driver which, of all the driver options, has the most detrimental effect on the previous stage and may worsen the overall delay. In addition, using unnecessarily large drivers wastes area and power resources.

It is possible to actually temporarily commit the buffer insertion candidate solution obtained through the above program to the design, trying various power levels, and timing the design in Step 5. However, not surprisingly, it becomes expensive in terms of processing time to make O(nM) critical path queries. Thus, a different approach is needed to capture the effect on increasing capacitance upstream by the selection of a particular driver, without actually making queries to the timing analyzer.

In order to capture the effect on increasing capacitance upstream by the selection of a particular driver, the delay penalty D(Cp) is added to the determination of the slack in step 4. The delay penalty is a function of the input capacitance of the driver and the driver type. The larger the input capacitance, the larger the penalty will be upstream.

For a driver p, Cp is the capacitive load of the input pin along the most critical path. The associated delay penalty D(Cp) is defined as the minimum delay to drive the capacitance Cp by a cascaded buffer chain starting with a buffer with smallest input capacitance. The reason for this definition is that buffer insertion can always be applied to the preceding net in the critical path. Indeed, one possibility is to insert a series of buffers directly in front of the driver p to isolate the potentially large capacitance Cp on the driver of the previous logic stage.

The minimum delay needed to isolate the capacitance is used as an estimation of the delay penalty. This estimation is pessimistic because better ways to insert buffers may be possible. However, this should not be a problem since the estimation is used only as a relative measure to compare different driver sizes.

In order to compute the delay penalty for a driver in the driver library, assume that a buffer library B consisting of n buffers $B_1, \ldots, B_n$ is given. Let Delay $(B_i, C_L)$ be the delay for buffer $B_i$ to drive a given load $C_L$, and let $C_{Bi}$ be the input capacitance of buffer $B_i$. The buffers are ordered such that $C_{B1} \leq C_{B2} \leq \ldots \leq C_{bn}$ in the buffer library.

The delay penalty $D(C_L)$ is defined to be the minimum delay over all possible chains of buffers from B to drive $C_L$ such that the first buffer is $B_1$. If $C_L \leq C_{B1}$, then adding a buffer chain only increases the capacitance seen by the previous driver, so $D(C_L)$ is defined as zero.

The following lemma allows the use of a dynamic programming technique to construct optimal buffer chains. Dynamic programming is an optimization technique in which solutions are built by generating optimal subsolutions and then combining them in an optimal way.

Assume that for each $B_1 \in B$, Delay$(B_i, C_L)$ is monotone non-decreasing in $C_L$.

LEMMA 1: In any optimal buffer chain, the load $C_L$ driven by any buffer $B_j$ must be greater than $C_{Bj}$.

PROOF: Assume that the load $C_L$ driven by $B_j$ is less than or equal to $C_{Bj}$. Assume $B_i$ directly precedes $B_j$ in the buffer chain. Since $C_L \leq C_{Bj}$ and delay is monotone decreasing, Delay$(B_i, C_L) \leq$ Delay$(B_i, C_{Bj})$. Since Delay $(j, C_L) > 0$, removing $B_j$ from the buffer chain reduces the overall delay, which means the chain is not optimal. The contradiction implies that we must have $C_L > C_{Bj}$.

Figure 4:
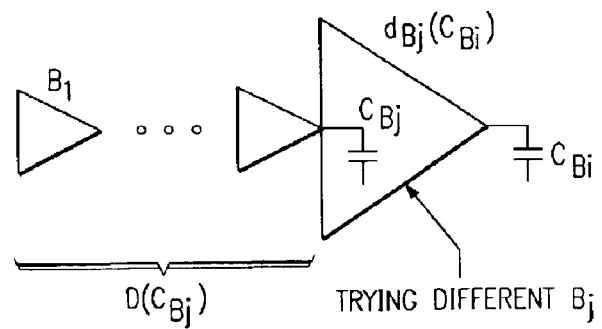
FIG. 4 is an exemplary diagram illustrating a dynamic programming technique to construct optimal buffer chains.

It will first be described how to compute delay penalties to drive the input capacitances of buffers, i.e. $D(C_{Bi})$ for all i. For the optimal buffer chain to drive capacitance $C_{Bi}$, if $B_j$ is the last buffer in the chain, then according to Lemma 1, $C_{Bj} < C_{Bi}$, which implies j<i. That means the optimal buffer chain to drive $C_{Bi}$ can be constructed by appending a buffer $B_j$ to the optimal buffer chain to drive capacitance $C_{Bj}$, where $j \in \{1, \ldots, i-1\}$. This is illustrated in FIG. 4.

To be more specific, $D(C_{Bi})$ can be calculated by dynamic programming as follows:

$$D(C_{B1}) = 0$$

$$D(C_{Bi}) = \min_{1 \leq j \leq i-1} [D(C_{Bj}) + \text{Delay}(B_j, C_{Bi})]$$

for $i = 2, 3, \ldots, n$

For any load with capacitance $C_L$ other than $C_{Bi}, \ldots, C_{Bn}$, the delay penalty is given by finding the buffer $B_j$ such that the delay of the optimal chain through $B_j$ plus the delay of $B_j$ driving $C_L$ is minimized. This is given as:

$$D(C_L) = \min_{1 \leq j \leq n} [D(C_{Bj}) + \text{Delay}(B_j, C_L)]$$

Assume each delay query Delay$(B_i, C)$ takes constant time. Then the time to compute the delay penalty for each buffer in B is $O(|B|^2)$. To compute the delay penalty for a load capacitance for any additional value takes $O(|B|)$ time. Note that only the delay penalties for driving input capacitances of buffers need only be computed once for each buffer library. Then the delay penalty and the corresponding optimal buffer chain can be stored for each buffer.

In the above calculations, it had been assumed that buffer delay is independent of input slew. However, the methodology may be modified to include signal slew in the calculation of delay penalty as follows:

First, the buffer chain can be constructed as described previously. Then, the slew can be propagated along the buffer chain. Finally, the delay penalty can be computed according to the slew-dependent buffer delay model.

Although this extension of the methodology works well in practice, the original buffer chain may not be optimal if slew is considered. The optimal buffer chains with slew consideration can be found by a more elaborate dynamic programming technique.

The principle is to propagate both delays and output slews of buffer chains in the dynamic programming algorithm. For each load value, many pairs of delay and output slew are stored as solutions with each pair corresponding to a different buffer chain. All the solution pairs are considered when solution pairs for larger load values are constructed.

In other words, for buffer $B_i$, let Delay$(t, B_i, C_L)$ be the delay and Slew$(t, B_i, C_L)$ be the output slew of $B_i$, where t is the input slew and $C_L$ is the load capacitance. Let $t_0$ be the input slew to the buffer chain. Let $DT(t, C_L)$ be the pairs of delay and output slew for a buffer chain to drive $C_L$ if the input slew is t. Then for i=2, 3, $\ldots$, n, DT $(t_0, C_{Bi})$ can be calculated by dynamic programming as follows:

$$DT(t_0, C_{Bi}) = \{(d + \text{Delay}(t, B_j, C_{Bi}), \text{Slew}(t, B_j, C_{Bi})): (d, t) \in DT(t_0, C_{Bj}), 1 \leq j \leq n\}$$

where d is the delay corresponding to the delay/slew pair in $DT(t_0, C_{Bj})$.

Note that for any fixed $t_0$ and $C_{Bi}$, if there are two pairs in $DT(t_0, C_{Bi})$ such that one is less than the other in both delay and output slew, then the second pair can be pruned without affecting the optimality of the methodology.

For any load with capacitance $C_L$ other than $C_{B1}, \ldots C_{Bn}$, $DT(t_0, C_L)$ is given by:

$$DT(t_0, C_L) = \{(d + \text{Delay}(t, B_j, C_L), \text{Slew}(t, B_j, C_L)): (d, t) \in DT(t_0, C_{Bj}), 1 \leq j \leq n\}$$

The delay penalty for a load with capacitance $C_L$ is given by the minimum delay over all the pairs in DT $(t_0, C_L)$.

If there are inverters in the buffer library, in addition to $D(C_{Bi})$, the delay penalty for the inverters may be define as $D'(C_{Bi})$. Then $D(C_{Bi})$ and $D'(C_{Bi})$ for all i can still be calculated by dynamic programming in $O(|B|^2)$ time as follows:

$$D(C_{B1}) = 0 \text{ if } B_1 \text{ is non-inverting}; \infty \text{ if } B_1 \text{ is inverting}$$

$$D'(C_{B1}) = \infty \text{ if } B_1 \text{ is non-inverting}; 0 \text{ of } B_1 \text{ is inverting}$$

$$D(C_{Bi}) = \min[D(C_{Bj}) + \text{Delay}(B_j, C_{Bi})] \text{ if } B_j \text{ is}$$
$$\text{non-inverting}; \min[D'(C_{Bj}) + \text{Delay}(B_j, C_{Bi})]$$
$$\text{if } B_j \text{ is inverting } 1 \leq j \leq i-1, \text{ for } i = 2, 3, \ldots, n$$

$$D'(C_{Bi}) = \min[D(C_{Bj}) + d_{B_j}(C_{Bi})]$$
$$\text{if } B_j \text{ is inverting } \min[D'(C_{Bj}) + d_{B_j}(C_{Bi})]$$
$$\text{if } B_j \text{ is non-inverting}; 1 \leq j \leq i-1,$$
$$\text{for } i = 2, 3, \ldots, n$$

The delay penalty $D(C_L)$ for each other $C_L$ value can be calculated in $O(|B|)$ time:

$$D(C_L) = \min[D(C_{Bj}) + \text{Delay}(B_j, C_L)] \text{ if } B_j \text{ is}$$
$$\text{non-inverting } \min[D'(C_{Bj}) + \text{Delay}(B_j, C_L)]$$
$$\text{if } B_j \text{ is inverting}; 1 \leq j \leq n$$

Besides causing more delay in preceding stage, a larger driver also occupies more area and potentially induces more buffers in the preceding stage. These extra costs associated with driver sizing can be modeled as follows:

Total penalty=Delay penalty+α*Driver area.

The user-defined constant α converts the driver area into units of time so that it can be added to the delay penalty and to specify the relative importance of delay and area.

For the delay penalty computation technique described above, each query of delay penalty takes $O(|B|)$ time. A query needs to be made for each candidate buffer insertion solution generated and for each driver size. Hence, the delay penalty computation can be expensive. For example, in a circuit design in which buffer insertion and driver sizing are considered for 3000 nets, and a the library of 48 buffers, a total of 6.2 millions queries are required. As a result, the extended van Ginneken algorithm runs 35% slower than the known van Ginneken algorithm.

To reduce the time spent on delay penalty computation, a table may be constructed to store delay penalty values for a large range of capacitance values before the extended van Ginneken's algorithm is ever called. Since the delay penalty $D(C_L)$ increases faster when $C_L$ is small and slower when $C_L$ is large, a non-uniform interpolation for the lookup table is more efficient. The following function to convert the capacitive load $C_L$ into the index of the table works well in practice:

Index into table=Round-to-Integer($M$*(log($C_L/C_{min}$)/log($C_{max}/C_{min}$)))

where M is the number of entries in the table, and $C_{min}$ and $C_{max}$ are a lower bound and an upper bound on $C_L$, respectively. When M=3000 and $C_{max}=20000*C_{min}$, it is observed that this table-lookup method causes less than 0.1% error in delay penalty values and introduces virtually no extra runtime.

Figure 5:
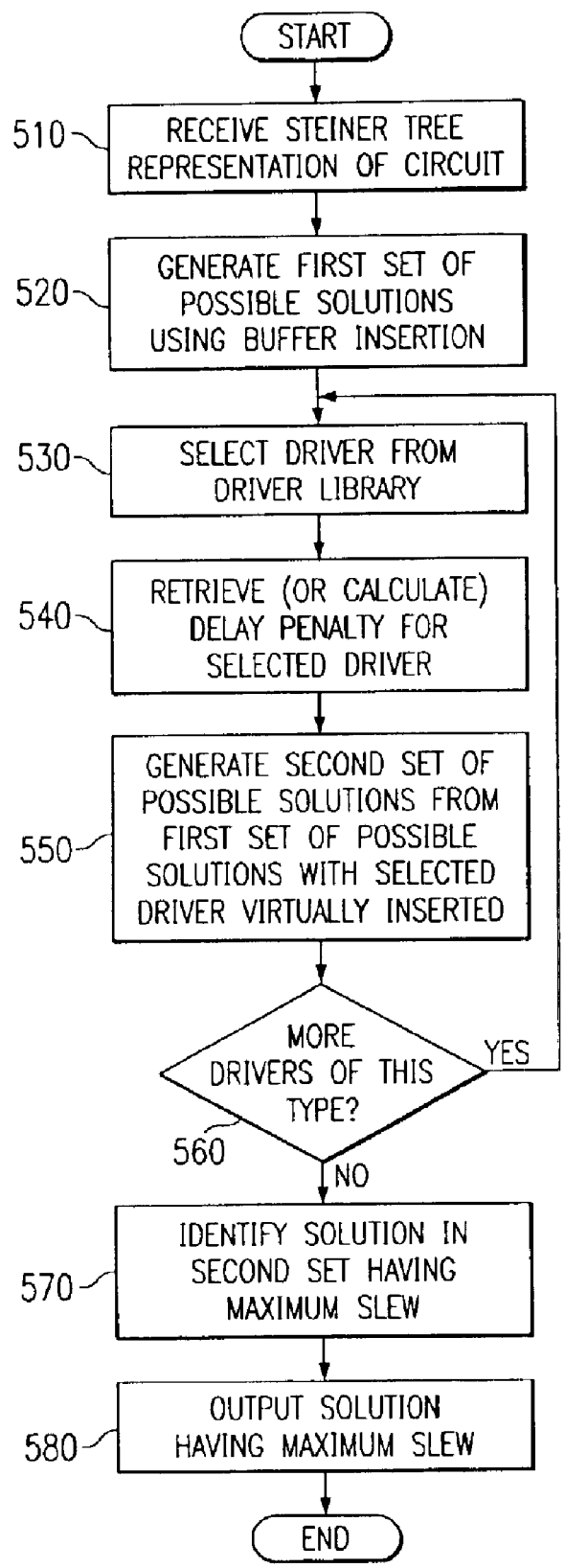
FIG. 5 is a flowchart outlining an exemplary operation of the present invention.

FIG. 5 is a flowchart outlining an exemplary operation of the present invention when optimizing a Steiner tree wiring pattern using simultaneous buffer insertion and driver sizing. As shown in FIG. 5, the operation starts with receiving a Steiner tree representation of the circuit design (step 510). Buffer insertion is performed on the Steiner tree using the van Ginneken algorithm to generate a first set of possible optimal solutions (step 520). For each solution in the first set, a driver of the same type as the original driver in the Steiner tree is selected from a driver library and virtually inserted into the solution (step 530). A delay penalty is retrieved for the selected driver (step 540). This delay penalty is then used with the new driver characteristics to generate a second set of solutions (step 550).

A determination is made as to whether there are other drivers of this type in the driver library (step 560). If so, the operation returns to step 530 and a next driver of this driver type is selected. If not, the second set of solutions is traversed to identify a solution having a maximum slack (step 570). The solution having the maximum slack is then output as the optimized Steiner tree representation of the circuit design (step 580). This optimized Steiner tree representation may then be used to fabricate the circuit.

Thus, the present invention provides a method and apparatus in which buffer insertion and driver sizing are performed simultaneously to yield an optimum solution for wiring a circuit design. In this way, the interdependency of buffer insertion and driver sizing is taken into account and a truly optimal solution is obtained relative to prior art sequential methods of optimization.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes,of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method in a data processing system for generating an optimum circuit design from an input circuit design, comprising:
    receiving the input circuit design, wherein the input circuit design includes at least one original driver;
    performing buffer insertion optimization on the input circuit design to generate a first set of solutions having a plurality of solutions;
    performing driver sizing optimization on the first set of solutions to generate a second set of solutions including, for a driver in a driver library having a same driver type as the original driver, calculating a slack for each solution in the second set of solutions based on a slack of the solution in the first set of solutions and at least one characteristic of the driver, wherein the at least one characteristic includes a delay penalty associated with the driver; and
    outputting, as the optimum circuit design, a solution from the second set of solutions.

2. The method of claim 1, further comprising:
    forming a circuit based on the optimum circuit design.

3. The method of claim 1, wherein performing buffer insertion optimization includes using a van Ginneken algorithm to perform buffer insertion in at least one net of the input circuit design.

4. The method of claim 1, wherein performing driver sizing optimization on the first set of solutions includes:
    identifying at least one driver in a driver library having a same driver type as an original driver in the input circuit design;
    virtually inserting the at least one driver into each solution in the first set of solutions; and
    determining a second set of solutions based on the first set of solutions having the at least one driver virtually inserted.

5. The method of claim 4, wherein determining a second set of solutions based on the first set of solutions having the at least one driver virtually inserted includes:
    calculating, for each solution in the set of second solutions, a slack based on a slack of a corresponding solution in the first set of solutions and a delay through the at least one driver.

6. The method of claim 5, wherein calculating the slack for each solution in the set of second solutions includes compensating for upstream effects of the at least one driver by including a delay penalty function in the calculation of the slack.

7. The method of claim 6, wherein the delay penalty function is the minimum delay to drive a predetermined capacitance load by a cascaded buffer chain starting with a buffer having a smallest input capacitance.

8. The method of claim 6, wherein including the delay penalty function in the calculation of the slack includes retrieving a delay penalty value for the at least one driver from a lookup table.

9. The method of claim 1, wherein the solution from the second set of solutions output as the optimum circuit design is a solution in the second set of solutions having a maximum slack.

10. A computer program product in a computer readable medium for generating an optimum circuit design from an input circuit design, comprising:

first instructions for receiving the input circuit design, wherein the input circuit design includes at least one original driver;

second instructions for performing buffer insertion optimization on the input circuit design to generate a first set of solutions having a plurality of solutions;

third instructions for performing driver sizing optimization on the first set of solutions to generate a second set of solutions including instructions for calculating, for a driver in a driver library having a same driver type as the original driver, a slack for each solution in the second set of solutions based on a slack of the solution in the first set of solutions and at least one characteristic of the driver, wherein the at least one characteristic includes a delay penalty associated with the driver; and fourth instructions for outputting, as the optimum circuit design, a solution from the second set of solutions.

11. The computer program product of claim 10, further comprising:

fifth instructions for forming a circuit based on the optimum circuit design.

12. The computer program product of claim 10, wherein the second instructions for performing buffer insertion optimization include instructions for using a van Ginneken algorithm to perform buffer insertion in at least one net of the input circuit design.

13. The computer program product of claim 10, wherein the third instructions for performing driver sizing optimization on the first set of solutions include:

instructions for identifying at least one driver in a driver library having a same driver type as an original driver in the input circuit design;

instructions for virtually inserting the at least one driver into each solution in the first set of solutions; and instructions for determining a second set of solutions based on the first set of solutions having the at least one driver virtually inserted.

14. The computer program product of claim 13, wherein the instructions for determining a second set of solutions based on the first set of solutions having the at least one driver virtually inserted include:

instructions for calculating, for each solution in the set of second solutions, a slack based on a slack of a corresponding solution in the first set of solutions and a delay through the at least one driver.

15. The computer program product of claim 14, wherein the instructions for calculating the slack for each solution in the set of second solutions include instructions for compensating for upstream effects of the at least one driver by including a delay penalty function in the calculation of the slack.

16. The computer program product of claim 15, wherein the delay penalty function is the minimum delay to drive a predetermined capacitance load by a cascaded buffer chain starting with a buffer having a smallest input capacitance.

17. The computer program product of claim 15, wherein the instructions for including the delay penalty function in the calculation of the slack include instructions for retrieving a delay penalty value for the at least one driver from a lookup table.

18. The computer program product of claim 10, wherein the solution from the second set of solutions output as the optimum circuit design is a solution in the second set of solutions having a maximum slack.

19. An apparatus, in a data processing system, for generating an optimum circuit design from an input circuit design, comprising:

means for receiving the input circuit design, wherein the input circuit design includes at least one original driver;

means for performing buffer insertion optimization on the input circuit design to generate a first set of solutions having a plurality of solutions;

means for performing driver sizing optimization on the first set of solutions to generate a second set of solutions including means for calculating, for a driver in a driver library having a same driver type as the original driver, calculating a slack for each solution in the second set of solutions based on a slack of the solution in the first set of solutions and at least one characteristic of the driver, wherein the at least one characteristic includes a delay penalty associated with the driver; and means for outputting, as the optimum circuit design, a solution from the second set of solutions.

* * * * *